US012233436B2

(12) United States Patent
Lee et al.

(10) Patent No.: US 12,233,436 B2
(45) Date of Patent: Feb. 25, 2025

(54) HAPTIC ACTUATOR AND ELECTRONIC DEVICE INCLUDING SAME

(71) Applicant: Samsung Electronics Co., Ltd., Suwon-si (KR)

(72) Inventors: Jeongseok Lee, Suwon-si (KR); Kwonho Song, Suwon-si (KR); Junho Noh, Cheongju-si (KR); Soonkoo Shim, Cheongju-si (KR); Minku Lee, Cheongju-si (KR); Youngbin Chong, Cheongju-si (KR); Namjin Choi, Cheongju-si (KR); Taesik Kim, Suwon-si (KR); Woonki Dae, Suwon-si (KR); Yudong Bae, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 329 days.

(21) Appl. No.: 17/649,394

(22) Filed: Jan. 31, 2022

(65) Prior Publication Data
US 2022/0152652 A1 May 19, 2022

Related U.S. Application Data

(63) Continuation of application No. PCT/KR2020/009655, filed on Jul. 22, 2020.

(30) Foreign Application Priority Data

Aug. 5, 2019 (KR) .................. 10-2019-0095010

(51) Int. Cl.
*B06B 1/04* (2006.01)
*H02K 1/02* (2006.01)
(Continued)

(52) U.S. Cl.
CPC ............... *B06B 1/045* (2013.01); *H02K 1/02* (2013.01); *H02K 1/34* (2013.01); *H02K 33/02* (2013.01)

(58) Field of Classification Search
CPC .......... H02K 1/02; H02K 1/34; H02K 33/02; H02K 2213/03; B06B 1/045; H01F 1/44; H10N 30/20; G06F 3/01
(Continued)

(56) References Cited

U.S. PATENT DOCUMENTS 9,742,254 B1 * 8/2017 Choi ....................... G06F 3/016
2011/0198949 A1 8/2011 Furuichi et al.
(Continued)

FOREIGN PATENT DOCUMENTS

DE 69833770 T2 * 8/2006
DE 69835677 T2 * 5/2007
(Continued)

OTHER PUBLICATIONS

Translation of foreign document KR 20110055757 A (Year: 2011).*
(Continued)

*Primary Examiner* — Alex W Mok

(57) ABSTRACT

An actuator according to various embodiments of the present invention comprises: a stator including a bracket, a yoke located on the bracket, and a coil for encompassing the circumference of the yoke; a permanent magnet encompassing the circumference of the coil; a vibrator including a weight encompassing the circumference of the permanent magnet, and a plate for supporting the permanent magnet and the weight; an elastic member located between the bracket and the vibrator so as to support the vibrator; and a magnetic fluid which is located between the vibrator and the stator, and which provides damping stability when the vibrator vibrates, wherein the weight of the magnetic fluid (Continued)

can be between 0.24% to 0.71% on the basis of the weight of the vibrator. Other various embodiments are possible.

18 Claims, 13 Drawing Sheets

(51) Int. Cl.
*H02K 1/34* (2006.01)
*H02K 33/02* (2006.01)

(58) Field of Classification Search
USPC .......................................................... 310/10
See application file for complete search history.

(56) References Cited

U.S. PATENT DOCUMENTS

| | | | |
|---|---|---|---|
| 2011/0309691 A1 | 12/2011 | Park et al. | |
| 2012/0319506 A1* | 12/2012 | Shim | H02K 33/16 310/25 |
| 2013/0033126 A1* | 2/2013 | Choi | H02K 33/18 310/25 |
| 2013/0093266 A1* | 4/2013 | Hong | H02K 33/18 29/446 |
| 2013/0113305 A1* | 5/2013 | Choi | H02K 33/18 310/15 |
| 2014/0232211 A1 | 8/2014 | Katada et al. | |
| 2018/0006542 A1 | 1/2018 | Choi et al. | |
| 2019/0103796 A1* | 4/2019 | Shim | H02K 33/04 |
| 2019/0238038 A1 | 8/2019 | Kim et al. | |

FOREIGN PATENT DOCUMENTS

| | | | |
|---|---|---|---|
| EP | 1017067 B1 * | 3/2006 | |
| JP | 4604415 B2 * | 1/2011 | |
| JP | 2011-189337 A | 9/2011 | |
| JP | 2018-182941 A | 11/2018 | |
| KR | 10-0177569 B1 | 5/1999 | |
| KR | 10-1004907 B1 | 12/2010 | |
| KR | 101034222 B1 * | 5/2011 | |
| KR | 20110055757 A | 5/2011 | |
| KR | 20180035258 A | 4/2018 | |
| KR | 10-2018-0055388 A | 5/2018 | |
| KR | 20190022259 A * | 3/2019 | |
| WO | WO-2019039717 A1 * | 2/2019 | |

OTHER PUBLICATIONS

International Search Report and Written Opinion of the International Searching Authority in connection with International Application No. PCT/KR2020/009655 issued Oct. 30, 2020, 10 pages.
Office Action issued Apr. 20, 2024, in connection with Korean Patent Application No. KR10-2019-0095010, 16 pages.
Office Action issued Dec. 20, 2024, in connection with Korean Patent Application No. 10-2019-0095010, 5 pages.

* cited by examiner

HAPTIC ACTUATOR AND ELECTRONIC DEVICE INCLUDING SAME

This application is continuation of International Application No. PCT/KR2020/009655, filed Jul. 22, 2020, which claims priority to Korean Patent Application No. 10-2019-0095010, filed Aug. 5, 2019, the disclosures of which are herein incorporated by reference in their entirety.

BACKGROUND

1. Field

Various embodiments of the disclosure relate to vibration of a haptic actuator mounted in an electronic device.

2. Description of Related Art

An electronic device may have one or more haptic actuators disposed therein. The haptic actuator may be disposed in an electronic device to provide a variety of textures to a user according to an input action including a touch.

The haptic actuator may include a stator and a vibrator. When a current is applied, the vibrator on the stator may vibrate with a constant frequency, thereby providing a variety of textures, for example, a sense of touch, to a user. The actuator is configured in such a structure that, when a current is applied to a coil disposed in the stator, the stator generates an electromagnetic force in cooperation with a permanent magnet disposed in the vibrator and the vibrator operates.

Most of haptic patterns in the haptic actuator have a short operating time of 30 ms or less. In addition, even though vibration patterns have the same time and the same vibration force, different haptic textures may be provided if the vibration patterns have different driving frequencies.

In designing a haptic actuator, it is very important to control a damping value, and, in order to obtain a vibration force more efficiently, a damping effect should be removed as far as possible when an elastic member or a magnetic field value is designed. An actuator having a low damping factor may have a very narrow operating frequency, but, when the damping factor increases, a vibration force in a resonance frequency may be reduced, but a usable frequency may increase.

Accordingly, when an actuator is designed, a damping value is closely related to a maximum vibration force or a usable frequency width, and also, may greatly influence dynamic characteristics of mass shift.

SUMMARY

However, in order to implement more various haptic effects, a haptic actuator having an optimal damping factor, which has a broader driving frequency and is capable of implementing a strong vibration force within a short time, may be required.

According to various embodiments of the disclosure, there are provided an actuator which provides damping stability by having an optimal damping factor, and an electronic device including the same.

According to various embodiments of the disclosure, an actuator of an electronic device may include: a stator including a bracket, a yoke positioned on the bracket, and a coil surrounding a circumference of the yoke; a vibrator including a permanent magnet surrounding a circumference of the coil, a weight surrounding a circumference of the permanent magnet, and a plate supporting the permanent magnet and the weight; an elastic member positioned between the bracket and the vibrator and configured to support the vibrator; and a magnet fluid positioned between the vibrator and the stator and configured to provide damping stability during vibration of the vibrator, and a weight of the magnet fluid may be between 0.24% and 0.71% of a weight of the vibrator.

According to various embodiments of the disclosure, a stable frequency according to a driving voltage may be obtained in a wide usable frequency domain, and stable haptic characteristics may be provided.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF DRAWINGS

For a more complete understanding of the present disclosure and its advantages, reference is now made to the following description taken in conjunction with the accompanying drawings, in which like reference numerals represent like parts.

DETAILED DESCRIPTION

Figure 1:
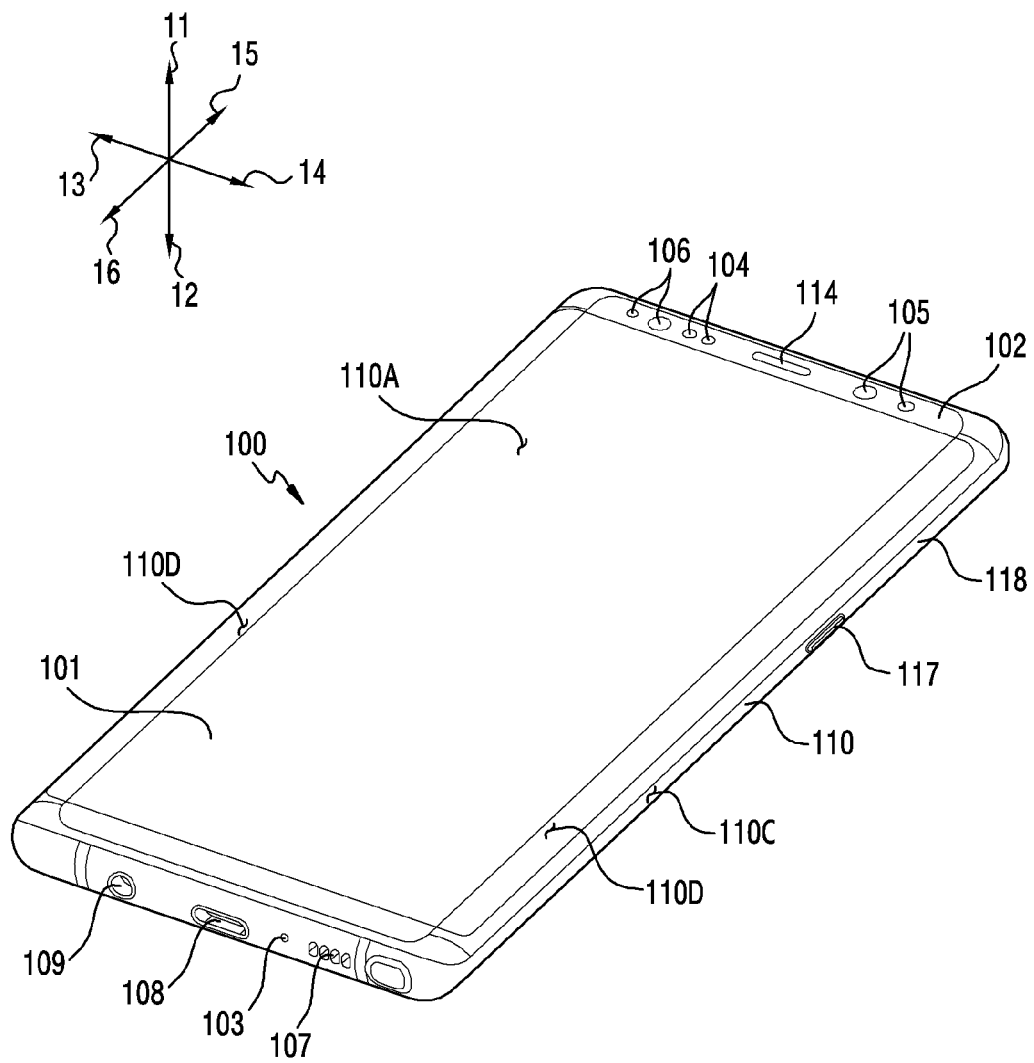
FIG. 1 is a perspective view illustrating a front view of an electronic device according to various embodiments of the disclosure.

Hereinafter, various embodiments of the disclosure will be described with reference to the accompanying drawings. However, these do not limit the disclosure to a specific embodiment, and should be understood as including various modifications, equivalents, and/or alternatives of embodiments. Regarding the description of drawings, similar reference numerals may be used for similar components.

An electronic device according to various embodiments of the disclosure may include at least one of, for example, a smartphone, a tablet personal computer (PC), a mobile phone, a video telephone, an electronic book (e-book) reader, a desktop PC, a laptop PC, a netbook computer, a workstation, a server, a personal digital assistant (PDA), a portable multimedia player (PMP), a Motion Picture Experts Group (MPEG-1 or MPEG-2) Audio Layer 3 (MP3) player, a mobile medical device, a cameras, or a wearable device (for example, smart glasses, a head-mounted-device (HMD), electronic apparel, an electronic bracelet, an electronic necklace, electronic appcessory, electronic tattoos, a smart mirror, or a smart watch).

According to some embodiments, the electronic device may be a home appliance. The home appliance may include at least one of, for example, a television (TV), a digital video disk (DVD) player, an audio, a refrigerator, an air conditioner, a cleaner, an oven, a microwave oven, a washing machine, an air cleaner, a set-top box, a home automation control panel, a security control panel, a TV box (for example, Samsung HomeSync™, Apple TV™, or Google TV™), a game console (for example, Xbox™ and PlayStation™), an electronic dictionary, an electronic key, a camcorder, or an electronic picture frame.

According to another embodiment, the electronic device may include at least one of medical devices (for example, various portable medical measurement devices (for example, a blood glucose monitoring device, a heartbeat measuring device, a blood pressure measuring device, a body temperature measuring device, and the like), a magnetic resonance angiography (MRA), a magnetic resonance imaging (MRI), a computed tomography (CT), scanners, and ultrasonic devices), a navigation device, a global positioning system (GPS) receiver, an event data recorder (EDR), a flight data recorder (FDR), a vehicle infotainment device, electronic equipment for vessels (for example, navigation systems and gyrocompasses), avionics, a security device, a head unit for a vehicle, an industrial or home robot, an automatic teller's machine (ATM) of a financial institution, points of sales (POS) of a store, or Internet of things (for example, light bulbs, various sensors, electricity or gas meters, sprinkler devices, fire alarms, thermostats, street lamps, toasters, exercise equipment, hot water tanks, heaters, boilers, or the like).

According to an embodiment, the electronic device may include at least one of furniture, part of buildings/structures, an electronic board, an electronic signature receiving device, a projector, or various measuring instruments (for example, water meters, electricity meters, gas meters, or wave meters). In various embodiments, the electronic device may be one or a combination of two or more devices of the above-mentioned devices. According to a certain embodiment, the electronic device may be a flexible electronic device. Also, the electronic devices according to various embodiments of the disclosure are not limited to the above-mentioned devices, and may include new electronic devices according to technology development.

Figure 2:
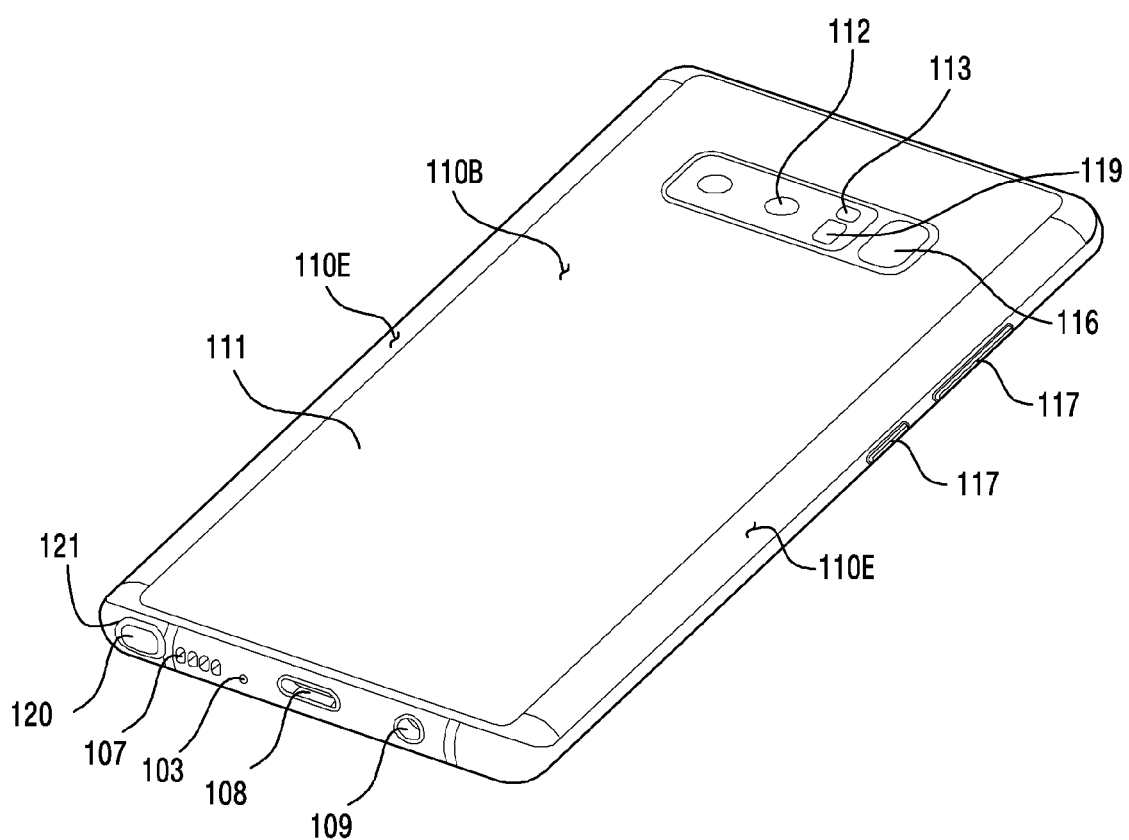
FIG. 2 is a perspective view illustrating a rear view of the electronic device according to various embodiments of the disclosure.

FIG. 1 is a perspective view illustrating a front view of a mobile electronic device according to an embodiment. FIG. 2 is a perspective view illustrating a rear view of the electronic device of FIG. 1.

Referring to FIGS. 1 and 2, the electronic device 100 according to an embodiment may include a housing 110 which includes a first surface (or a front surface) 110A, a second surface (or a rear surface) 110B, and a side surface 110C surrounding a space between the first surface 110A and the second surface 110B. In another embodiment (not shown), the housing may refer to a structure that forms a portion of the first surface 110A, the second surface 110B, and the side surface 110C of FIG. 1. According to an embodiment, the first surface 110A may be formed by a front surface plate 102 having at least part substantially transparent (for example, a glass plate including various coating layers, or a polymer plate). The second surface 110B may be formed by a rear surface plate 111, which is substantially opaque. The rear surface plate 111 may be formed by, for example, coated or colored glass, ceramic, a polymer, metal (for example, aluminum, stainless steel (STS), or magnesium), or a combination of at least two of the above-mentioned materials. The side surface 110C may be coupled with the front surface plate 102 and the rear surface plate 111, and may be formed by a side surface bezel (or a "side surface member") 118 which includes metal and/or a polymer. In certain embodiments, the rear surface plate 111 and the side surface bezel 118 may be integrally formed with each other, and may include the same material (for example, a metallic material such as aluminum).

In certain embodiments, the front surface plate 102 may include two first areas 110D bent from the first surface 110A toward the rear surface plate 111 and seamlessly extended, and disposed on both ends of long edges of the front surface plate 102. In the illustrated embodiment (see FIG. 2), the rear surface plate 111 may include two second areas 110E bent from the second surface 110B toward the front surface plate 102 and seamlessly extended, and disposed on both ends of long edges. In certain embodiments, the front surface plate 102 (or the rear surface plate 111) may include only one of the first areas 110D (or the second areas 110E). In certain embodiments, part of the first areas 110D or the second areas 110E may not be included. In certain embodiments, when viewed from a side surface of the electronic device 100, the side surface bezel 118 may have a first thickness (or width) on a side surface that does not include the first area 110D or the second area 110E described above, and may have a second thickness thinner than the first thickness on a side surface that includes the first area 110D or the second area 110E.

According to certain embodiments, the electronic device 100 may include at least one of a display 101, audio modules 103, 107, 114, sensor modules 104, 116, 119, camera modules 105, 112, 113, a input key 117, a light emitting element 106, a input pen 120, and connector holes 108, 109. In a certain embodiment, the electronic device 100 may omit at least one of the components (for example, the input key 117 or the light emitting element 106) or may additionally include other components.

The display 101 may be exposed through a substantial portion of the front surface plate 102, for example. According to certain embodiments, at least part of the display 101 may be exposed through the front surface plate 102 forming the first surface 110A and the first area 110D of the side surface 110C. In certain embodiments, a corner of the display 101 may be formed substantially the same as a shape of an outside border of the front surface plate 102 adjacent thereto. In certain embodiments, a gap between an outside border of the display 101 and an outside border of the front surface plate 102 may be formed substantially the same to extend an exposed area of the display 101.

In certain embodiments, a recess or an opening may be formed on part of a screen display area of the display 101, and the electronic device may include at least one of the audio module 114, the sensor module 104, the camera module 105, and the light emitting element 106 aligned with the recess or the opening. In certain embodiments, the electronic device may include at least one of the audio module 114, the sensor module 104, the camera module 105, the fingerprint sensor 116, and the light emitting element 106 disposed on a rear surface of the screen display area of the display 101. In certain embodiments, the display 101 may be coupled with or may be disposed adjacent to a touch sensing circuit, a pressure sensor for measuring an intensity (pressure) of a touch, and/or a digitizer for detecting a stylus pen of a magnetic field method. In certain embodiments, at least part of the sensor modules 104, 119, and/or at least part of the input key 117 may be disposed on the first area 110D and/or the second area 110E.

The audio modules 103, 107, 114 may include a microphone hole 103 and speaker holes 107, 114. The microphone hole 103 may have a microphone disposed therein to acquire an external sound, and in certain embodiments, the microphone hole may have a plurality of microphones disposed therein to detect a direction of a sound. The speaker holes 107, 114 may include an external speaker hole 107 and a receiver hole 114 for calling. In certain embodiments, the speaker holes 107, 114 and the microphone hole 103 may be implemented as one hole or a speaker may be included without the speaker holes 107, 114 (for example, a piezo speaker).

The sensor modules 104, 116, 119 may generate an electric signal or a data value corresponding to an internal operation state or an external environment state of the electronic device 100. The sensor modules 104, 116, 119 may include, for example, a first sensor module 104 (for example, a proximity sensor) and/or a second sensor module (for example, a fingerprint sensor) disposed on the first surface 110A of the housing 110, and/or a third sensor module 119 (for example, an HRM sensor) and/or a fourth sensor module 116 (for example, a fingerprint sensor) disposed on the second surface 110B of the housing 110. The fingerprint sensor may be disposed not only on the first surface 110A of the housing 110 (for example, the display 101), but also on the second surface 110B. The electronic device 100 may further include a sensor module, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112, 113 may include a first camera 105 disposed on the first surface 110A of the electronic device 100, a second camera 112 disposed on the second surface 110B, and/or a flash 113. The cameras 105, 112 may include one or a plurality of lenses, an image sensor, and/or an image signal processor. The flash 113 may include, for example, a light emitting diode or a xenon lamp. In certain embodiments, two or more lenses (an infrared camera, a wide-angle lens and a telephoto lens), or image sensors may be disposed on one surface of the electronic device 100.

The input key 117 may be disposed on the side surface 110C of the housing 110. In certain embodiments, the electronic device 100 may not include a portion or an entirety of the input keys 117 mentioned above, and the input key 117 that is not included may be implemented on the display 101 in other forms, such as a soft key. In certain embodiments, the input key may include the sensor module 116 disposed on the second surface 110B of the housing 110.

The light emitting element 106 may be disposed on the first surface 110A of the housing 110, for example. For example, the light emitting element 106 may provide state information of the electronic device 100 in the form of light. In certain embodiments, the light emitting element 106 may provide a light source interlocking with an operation of the camera module 105. The light emitting element 106 may include, for example, a light emitting diode (LED), an infrared LED (IR LED), and a xenon lamp.

The connector holes 108, 109 may include a first connector hole 108 to accommodate a connector (for example, a USB connector) for exchanging power and/or data with an external electronic device, and/or a second connector hole (for example, an earphone jack) 109 to accommodate a connector for exchanging an audio signal with an external electronic device.

The input pen 120 (for example, a stylus pen) may be guided and inserted into or removed from the housing 110 through a hole 121 formed on a side surface of the housing 110, and may include a button for mounting or dismounting the input pen 120 with ease. A separate resonance circuit may be embedded in the input pen 120 to interlock with an electromagnetic induction panel 390 (for example, a digitizer) included in the electronic device 100. The input pen 120 may include an electro-magnetic resonance (EMR) method, active electrical stylus (AES) and electric coupled resonance (ECR) methods.

Figure 3:
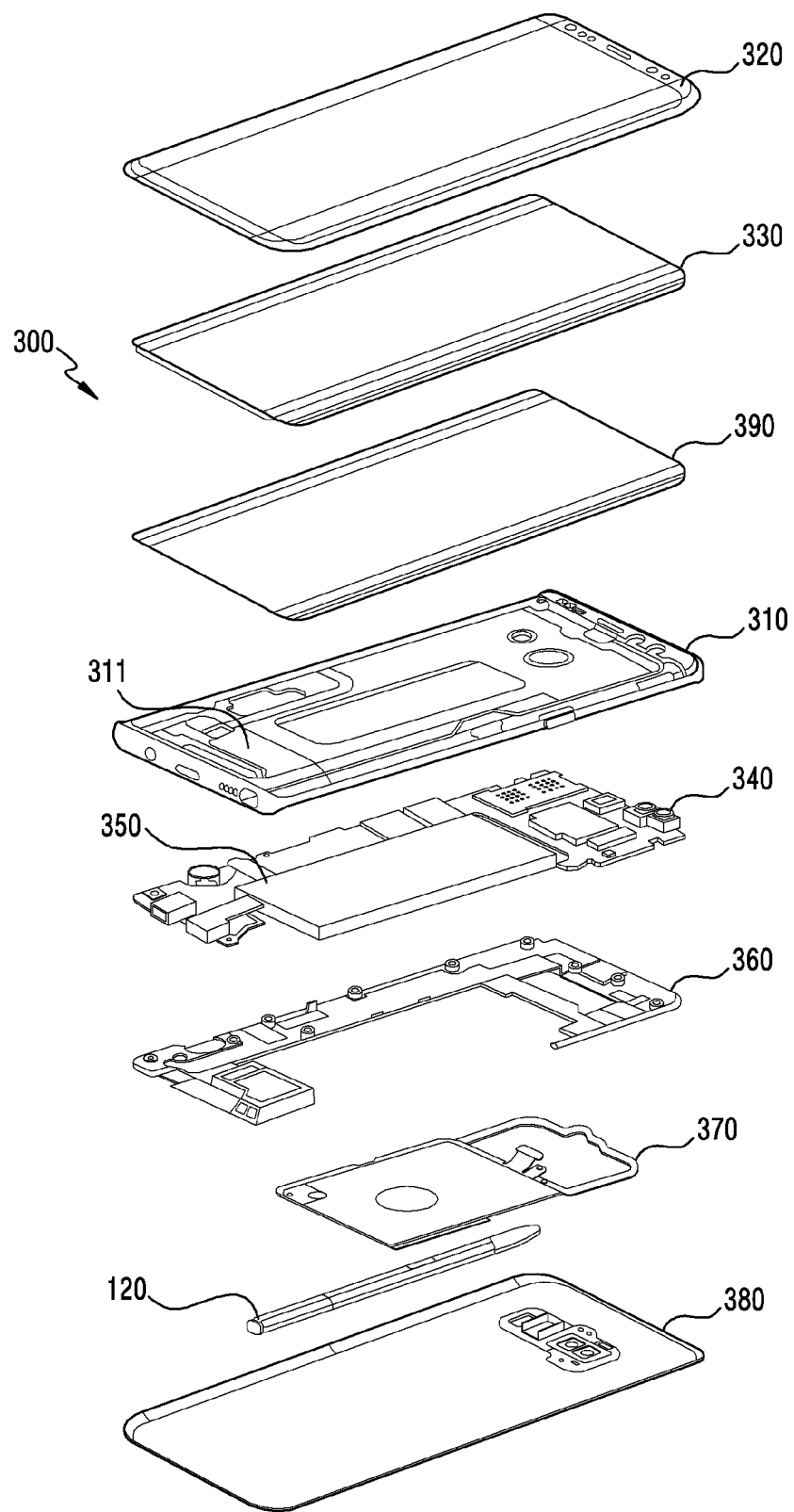
FIG. 3 is an exploded perspective view illustrating an inner configuration of the electronic device according to various embodiments of the disclosure.

FIG. 3 is an exploded perspective view illustrating an inner configuration of the electronic device of FIG. 1.

Referring to FIG. 3, the electronic device 300 may include a side surface bezel 310, a first support member 311 (for example, a bracket), a front surface plate 320, a display 330, an electromagnetic induction panel 390, a printed circuit board 340, a battery 350, a second support member 360 (for example a rear case), an antenna 370, a input pen 120, and a rear surface plate 380. In certain embodiments, the electronic device 300 may omit at least one (for example, the first support member 311 or the second support member 360) of the components, or may additionally include other components. At least one of the components of the electronic device 300 may be the same as or similar to at least one of the components of the electronic device 100 of FIG. 1 or 2, and a redundant explanation thereof is omitted.

The electromagnetic induction panel 390 (for example, a digitizer) may be a panel for detecting an input by the input pen 120. For example, the electromagnetic induction panel 390 may include a printed circuit board (PCB) (for example, a flexible printed circuit board (FPCB)), and a shielding sheet. The shielding sheet may prevent components (for example, the display module, the printed circuit board, and the electromagnetic induction module) included in the electronic device 100 from interfering with one another due to an electromagnetic field generated therefrom. The shielding sheet may block an electromagnetic field generated from the components, thereby enabling an input from the input pen 120 to be exactly transmitted to a coil included in the electromagnetic induction panel 390. According to various embodiments, the electromagnetic induction panel 390 may include an opening formed on at least part thereof corresponding to a biometric sensor mounted in the electronic device 100. For example, the electromagnetic induction panel 390 may be deleted from the electronic device 300.

The first support member 311 may be disposed inside the electronic device 300 to be connected with the side surface bezel 310, or may be integrally formed with the side surface bezel 310. For example, the first support member 311 may be formed with a metallic material and/or a nonmetallic material (for example, polymer). The first support member 311 may have one surface coupled with the display 330 and the other surface coupled with the printed circuit board 340. A processor, a memory, and/or an interface may be mounted on the printed circuit board 340. The processor may include, for example, one or more of a central processing device, an application processor, a graphic processing device, an image signal processor, a sensor hub processor, and a communication processor.

The memory may include, for example, a volatile memory or a nonvolatile memory.

The interface may include, for example, a high definition multimedia interface (HDMI), a universal serial bus (USB) interface, a secure digital (SD) card interface, and/or an audio interface. The interface may electrically or physically connect the electronic device 300 with an external electronic device, and may include a USB connector, an SD card/multimedia card (MMC) connector, or an audio connector.

The battery 350 may be a device that supplies power to at least one component of the electronic device 300, and may include, for example, a primary battery which is not rechargeable or a secondary battery which is rechargeable, or a fuel cell. At least part of the battery 350 may be disposed substantially on the same plane as the printed circuit board 340, for example. The battery 350 may be integrally disposed inside the electronic device 300, or may be removably disposed in the electronic device 300.

The antenna 370 may be disposed between the rear surface plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or may wirelessly transmit and receive power necessary for charging. In certain embodiments, an antenna structure may be formed by part of the side surface bezel 310 and/or the first support member 311, or a combination thereof.

Figure 4:
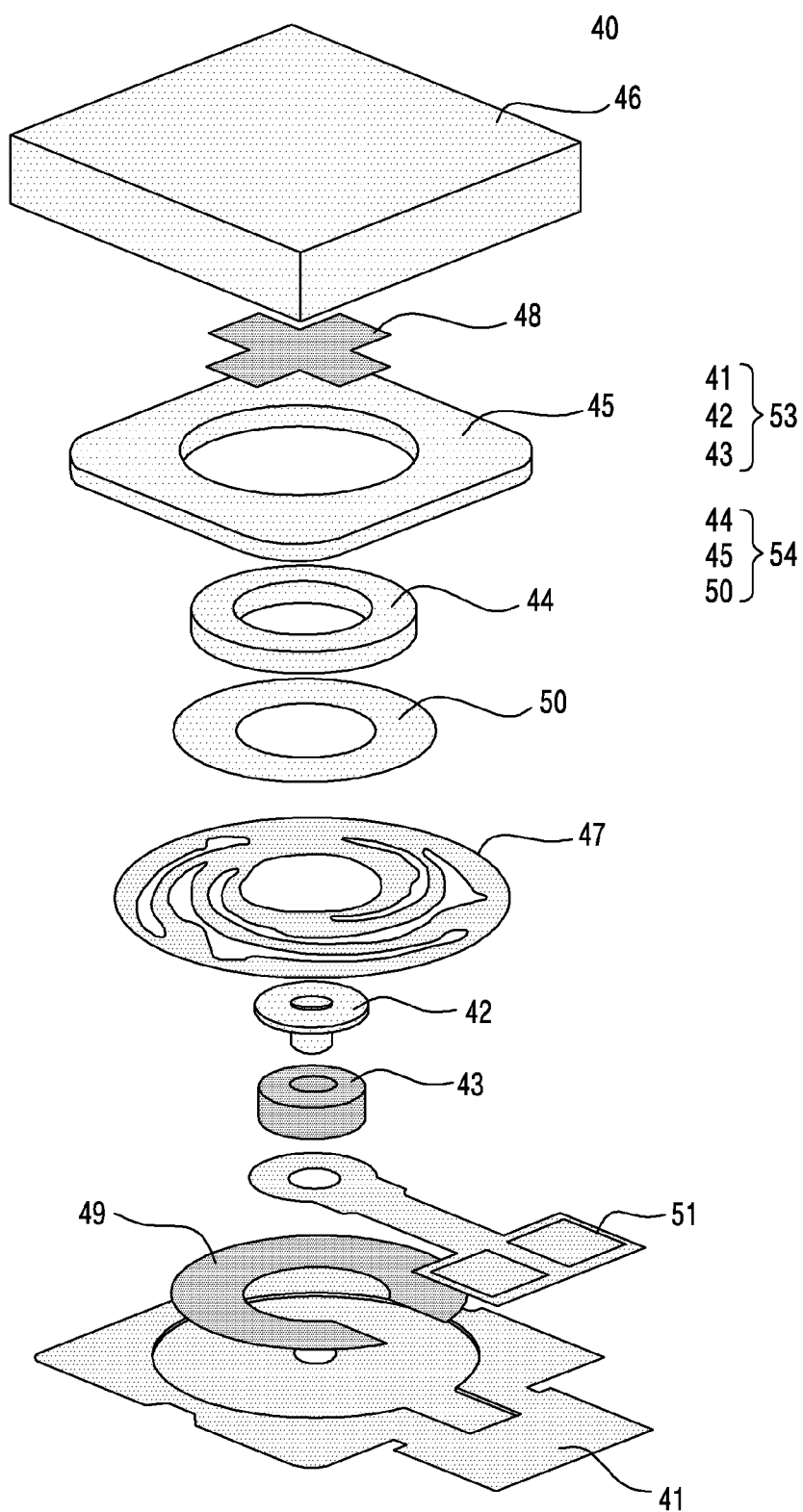
FIG. 4 is an exploded perspective view illustrating a structure of an actuator according to various embodiments of the disclosure.

FIG. 4 is an exploded perspective view illustrating a structure of an actuator according to various embodiments of the disclosure.

Referring to FIG. 4, at least one actuator 40 according to certain embodiments may be disposed in a housing. According to certain embodiments, the actuator 40 may be a vibration motor, for example, a haptic feedback vibration motor. According to certain embodiments, the actuator 40 may include a stator 53 and a vibrator 54. According to certain embodiments, the stator 53 may be a portion that does not vibrate, and the vibrator 54 may be a portion that vibrates when a current is applied to a coil 43.

According to certain embodiments, the stator 53 may include a bracket 41, a yoke 42, and a coil 43. According to certain embodiments, the yoke 42 and the coil 43 may be fixed onto the bracket 41. According to certain embodiments, the bracket 41 may be a support structure for supporting components received thereon on a bottom, and may be formed with a thin metal plate.

According to certain embodiments, the bracket 41 may further include a case 46. According to an embodiment, the case 46 may be coupled to the bracket 41 to serve as a housing. For example, the case 46 and the bracket 41 may be formed with a metallic material.

According to certain embodiments, the yoke 42 may be a support for supporting the coil 43, and may be inserted into a center protrusion 410 formed on the bracket 41 and fixed thereto. For example, the yoke 42 may have an insertion protrusion 420 formed thereon to be inserted into the center protrusion 410. For example, the yoke 42 may have an outer diameter ranging from 1.5 to 3.0 mm, and may be configured as an integrated or separate structure, and may be disposed to have a gap of at least 0.05 mm from a permanent magnet 44. The yoke 42 may be a member that forms a magnetic field closed circuit to maximize energy efficiency.

According to certain embodiments, the coil 43 may be supported on the yoke 42 and may be fixed onto the bracket 41. According to certain embodiments, the coil 43 may be disposed to surround the yoke 42. A current may be applied to the coil 43 and a vibration force may be generated according to generation of a magnetic force between the coil 43 through which the current is applied and the permanent magnet 44.

According to certain embodiments, the vibrator 54 may include the permanent magnet 44, a weight 45, and a plate 50. According to certain embodiments, the permanent magnet 44 may be disposed to surround the outer circumference of the coil 43. According to certain embodiments, the permanent magnet 44 may have a ring shape, and may include an upper surface and a lower surface of the ring shape. For example, the permanent magnet 44 may have a flux ranging from 6 to 15 μWb.

According to certain embodiments, the weight 45 may be disposed to surround the circumference of the permanent magnet 44. According to certain embodiments, the weight 45 may include an inner diameter surface.

According to certain embodiments, the actuator 40 may include the plate 50 disposed between the permanent magnet 44 and an elastic member 47. According to certain embodiments, the plate 50 may support the permanent magnet 44 and the weight 45, which are included in the vibrator 54. For example, the plate 50 may be deleted from the actuator 40.

According to certain embodiments, the actuator 40 may include the elastic member 47 between the stator 53 and the vibrator 54. According to certain embodiments, the elastic member 47 may be disposed between the bracket 41 and the vibrator 54 to support the vibrator 54. For example, the elastic member 47 may have a spring constant of 190-210 gf/mm, and may have a shape which gradually becomes narrower from a first end to a second end. According to certain embodiments, the elastic member 47 and the weight 45 may convert a magnetic force into kinetic energy.

According to certain embodiments, the actuator 40 may additionally have upper and lower dampers 48, 49 disposed therein to reduce a quantity of impact caused by an excessive vibration by the weight 45 and the permanent magnet 44. According to certain embodiments, the upper damper 48 may be disposed in the upper case 46, and the lower damper 49 may be disposed on the bracket 41. For example, the upper damper 48 and the lower damper 49 may include a sponge or a rubber.

According to certain embodiments, the actuator 40 may include an electric connection member 51 to apply a current to the coil 43. For example, the electric connection member 51 may include a flexible printed circuit board (FPCB).

Figure 5:
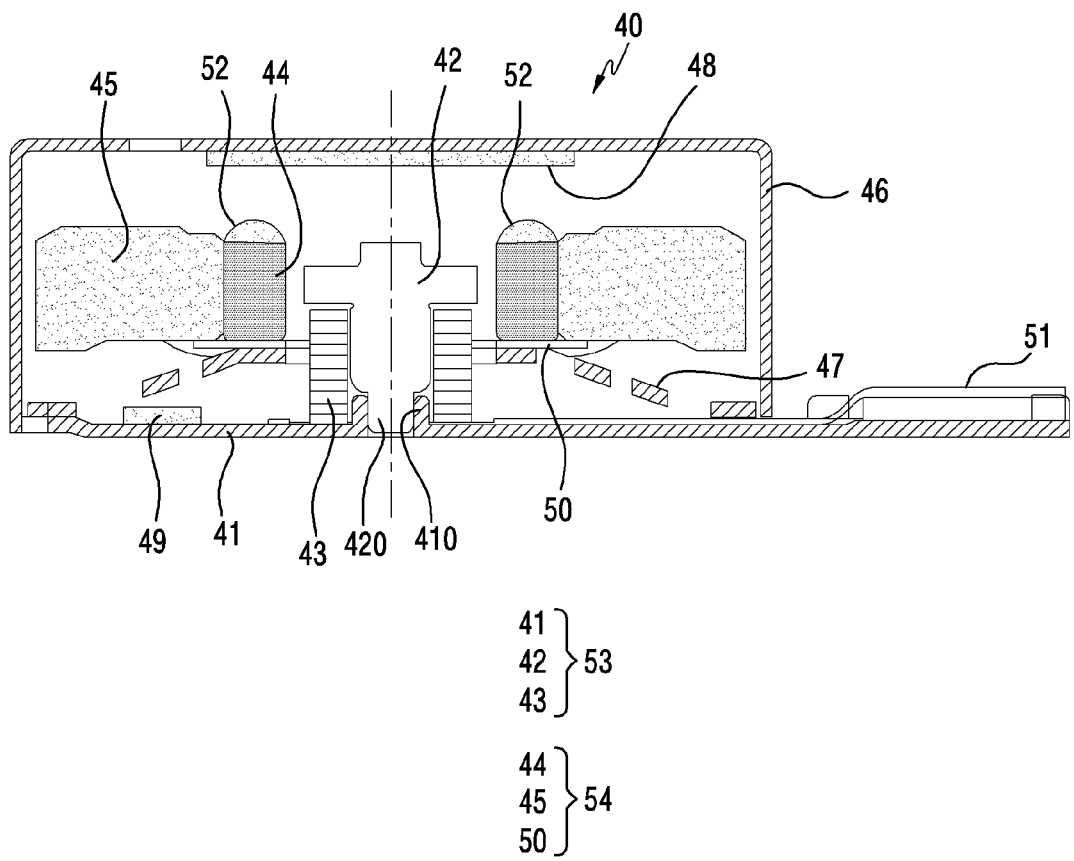
FIG. 5 is a cross-sectional view illustrating a structure of an actuator according to various embodiments of the disclosure.

FIG. 5 is a cross-sectional view illustrating a structure of an actuator according to various embodiments of the disclosure.

Referring to FIG. 5, according to certain embodiment, the actuator 40 may include a magnet fluid 52 disposed between the vibrator 54 and the stator 53 to provide damping stability when the vibrator 54 vibrates. According to certain embodiments, the permanent magnet 44 has an upper surface formed in a ring shape, and accordingly, the magnet fluid 52 may be coated over the upper surface of the permanent magnet 44 in a ring shape but may not be limited to the ring shape. According to certain embodiments, the magnet fluid 52 may have a viscosity to be coated over the upper surface of the permanent magnet 44 and not to be released therefrom. For example, the magnet fluid 52 may have a viscosity of 1000 cp or more.

According to certain embodiments, the magnet fluid 52 may control a quantity of vibration of the vibrator 54 according to how much the magnet fluid is coated. According to certain embodiments, the magnet fluid 52 may include magnetic fine particles, a surfactant, and a base oil. The base oil may be synthetic hydrocarbon oil. According to certain embodiments, a magnetic powder of the magnet fluid 52 may exist in the range of 1.76% to 1.8% out of a fluid (base oil).

According to an embodiment, in the actuator 40, a weight ratio of the magnet fluid 52 to the vibrator 54 may be between 0.24% and 0.71%. Vibration characteristics according to weight ratios of the magnet fluid 52 are shown in table 1 presented below:

TABLE 1

| c/m | MF mass | Bandwidth (3 dB) | Vibration characteristics (fo, 2.5 Vrms) | Haptic waveform (10Vop) | Haptic Use Range (3Gop) (10Vop) |
|---|---|---|---|---|---|
| 336 | 0 | <5 Hz | case touch on fo | Waveform broken | 250 Hz~400 Hz |
| 374 | 2.5 mg | | | | |
| 442 | 4.8 mg | ~100 Hz | 2.7 Grms | Stable waveform | 150 Hz~450 Hz |
| 504 | 6.7 mg | | 2.5 Grms | | |
| 521 | 9.1 mg | | 2.2 Grms | | |
| 541 | 11.5 mg | | 2.0 Grms | | |
| 665 | 23 mg | >100 Hz | 1.7 Grms | Waveform distorted | 250 Hz~400 Hz |

Referring to table 1, if a weight 45 is 1.68 g, a weight of a magnet fluid 52 provides a stable waveform in a range of about 4 mg to 12 mg. The weight of the magnet fluid 52 may be between 0.24 and 0.71%, of the weight of the vibrator 54.

The actuator including the magnet fluid 52 coated by a weight in the above-described range may provide a stable frequency according to a usable wide frequency domain and a driving voltage. For example, a maximum amount of magnet fluid 52 coated may not exceed 12 mg.

According to certain embodiments, a coupling structure may be formed between the bracket 41 and the yoke 42. According to certain embodiments, the coupling structure may be formed by coupling the center protrusion 410 and the insertion protrusion 420. According to certain embodiments, the center protrusion 410 may be formed on a lower end of the bracket 41 to allow the yoke 42 to be coupled thereto. For example, the center protrusion 410 may be formed in a hollow shape, and the insertion protrusion 420 of the yoke may be inserted into the hollow-shaped opening.

Figure 6:
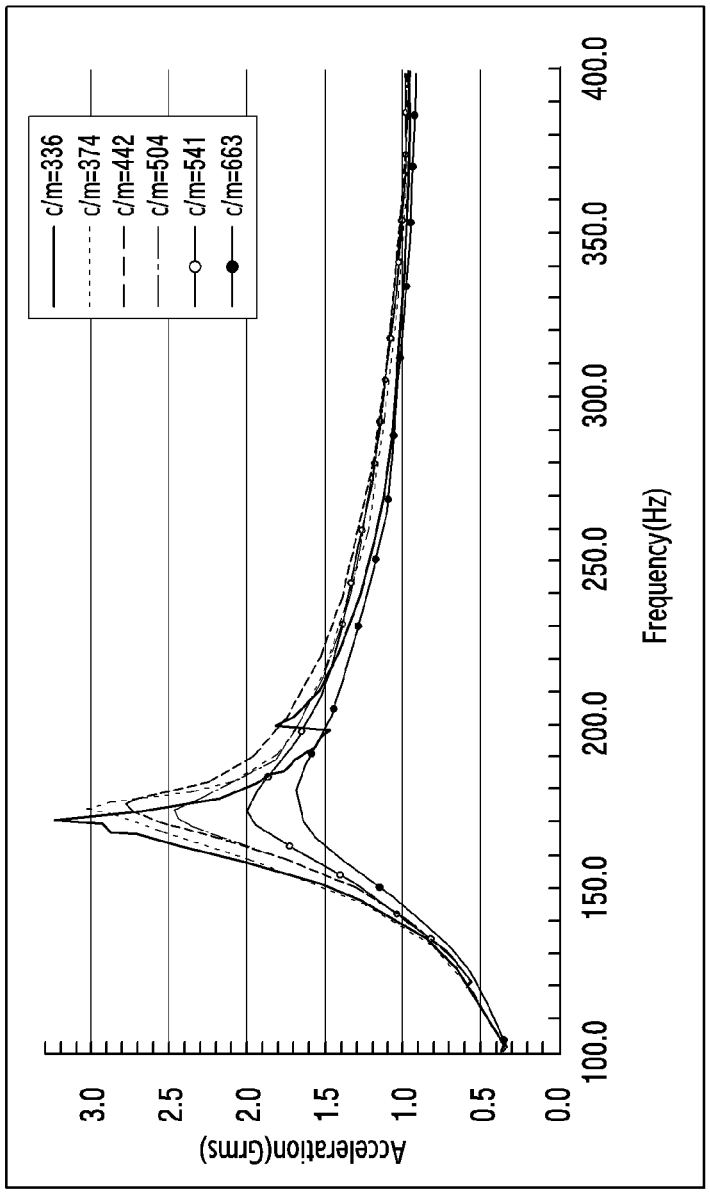
FIG. 6 is a graph showing vibration characteristics with frequency according to an increase of a damping factor according to various embodiments of the disclosure.
Figure 7:
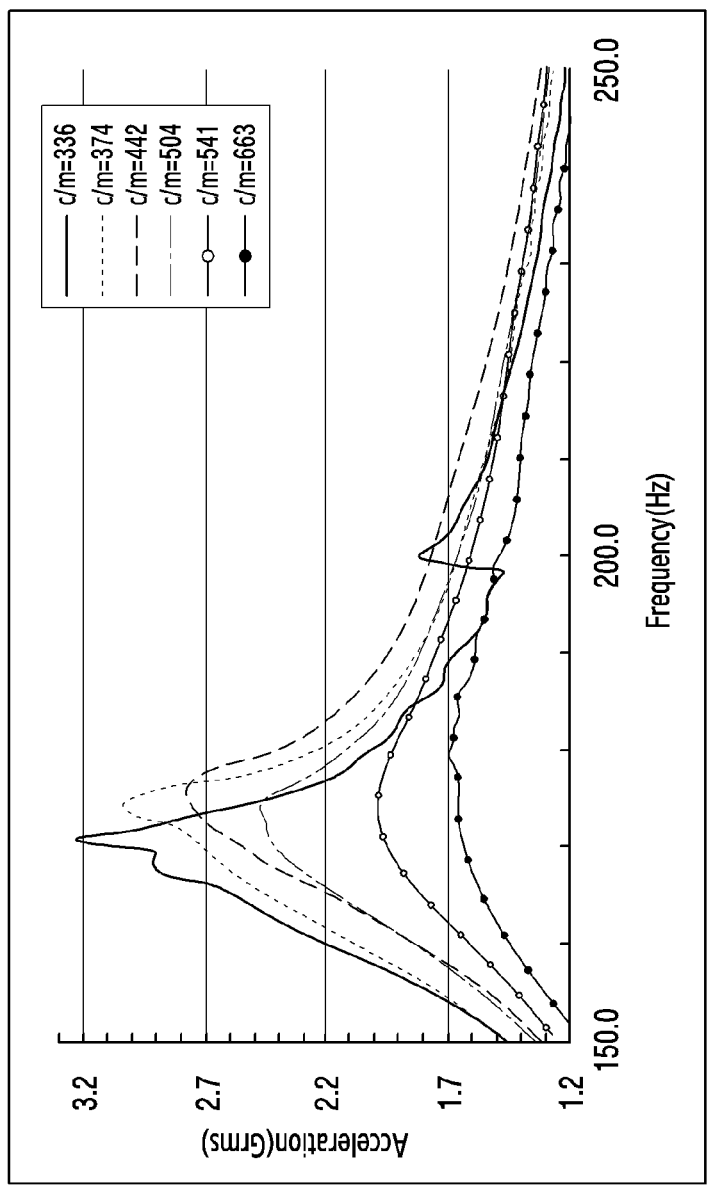
FIG. 7 is a graph enlarging some frequency sections of FIG. 6 according to various embodiments of the disclosure.

FIG. 6 is a graph showing vibration characteristics with frequency according to an increase of a damping factor according to various embodiments of the disclosure. FIG. 7 is a graph enlarging some frequency sections of FIG. 6 according to various embodiments of the disclosure.

Referring to FIGS. 6 and 7, according to certain embodiments, under the same driving condition (Vop=2.5 Vrms), as the damping factor (c/m or c) increases, a peak vibration force is reduced and a half width increases.

According to certain embodiments, when the damping factor (c/m) is smaller than 374, a distribution curve of vibration force is distorted by a touch of the upper case due to an increase of an amplitude of a vibrator (for example, the vibrator 54 shown in FIG. 5) (mass). On the other hand, the peak vibration is noticeably reduced when the damping factor (c/m) is larger than 541.

Figure 8:
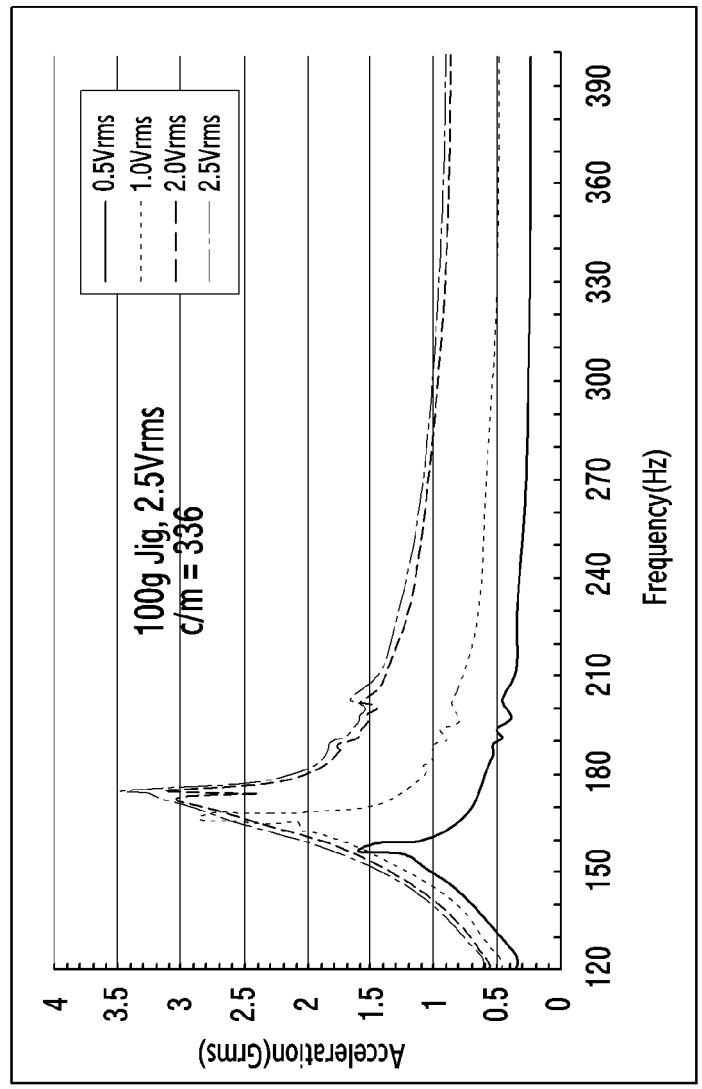
FIG. 8 is a graph showing vibration characteristics with frequency at different driving voltages when a damping factor (c/m) is 336 according to various embodiments of the disclosure.

FIG. 8 is a graph showing vibration characteristics with frequency at different driving voltages when the damping factor (c/m) is 336 according to various embodiments of the disclosure.

Figure 9:
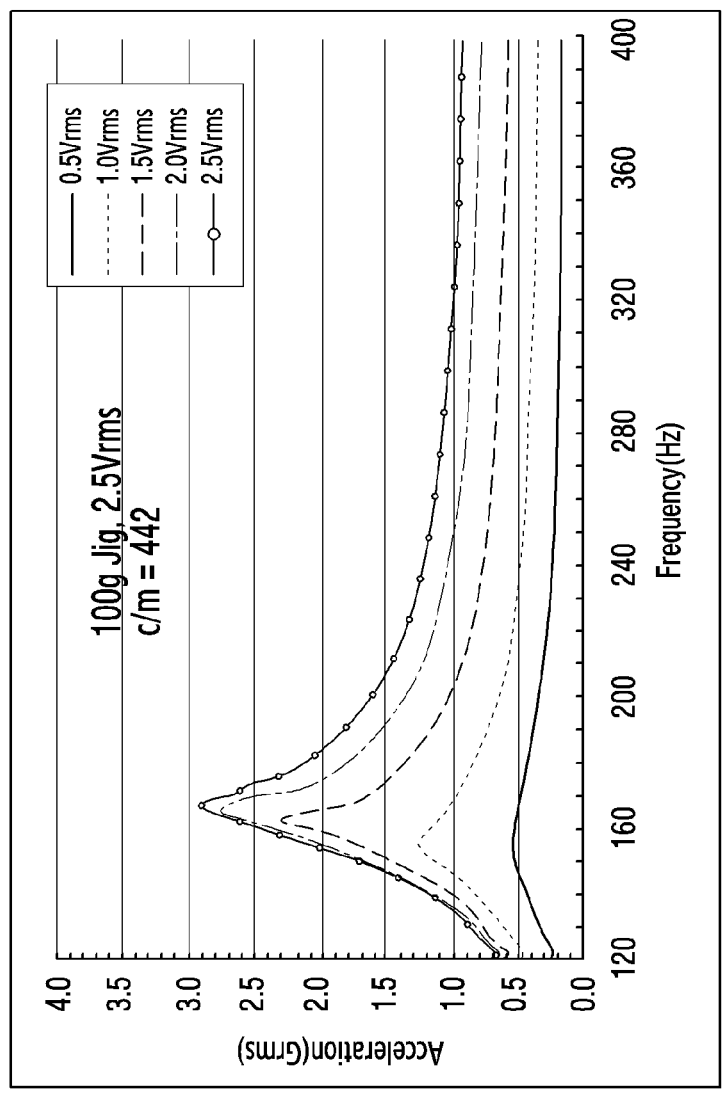
FIG. 9 is a graph showing vibration characteristics with frequency at different driving voltages when a damping factor (c/m) is 442 according to various embodiments of the disclosure.

FIG. 9 is a graph showing vibration characteristics with frequency at different operating voltages when the damping factor (c/m) is 442 according to various embodiments of the disclosure.

Figure 10:
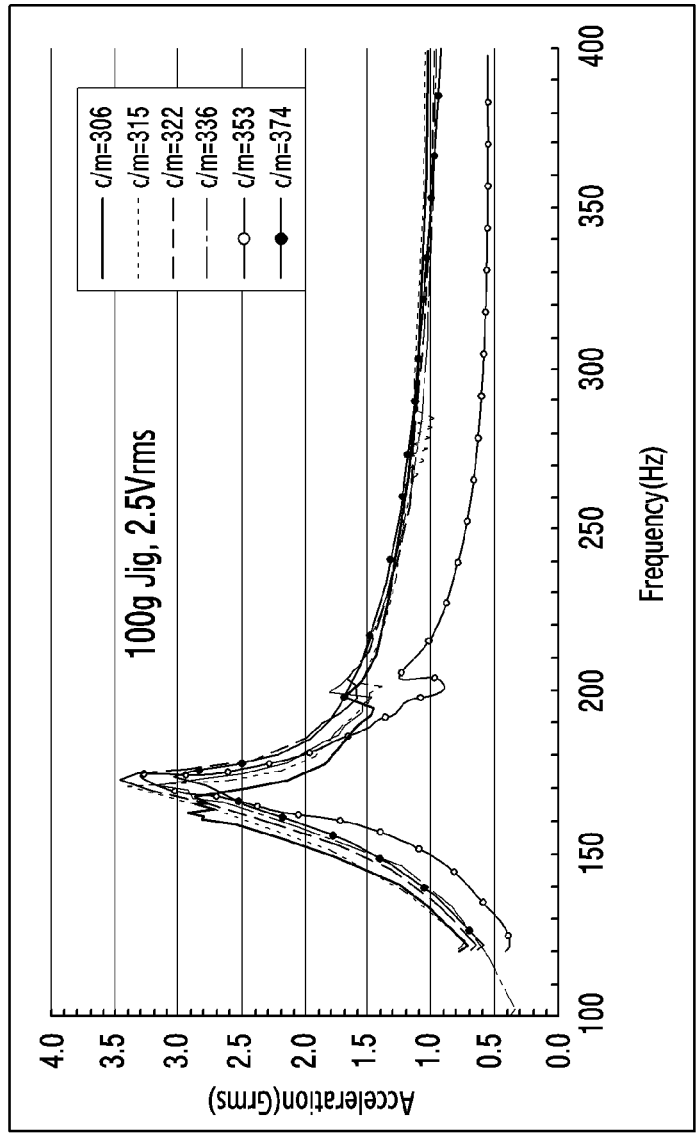
FIG. 10 is a graph showing vibration characteristics with frequency when a damping factor (c/m) is smaller than 374 according to various embodiments of the disclosure.

FIG. 10 is a graph showing vibration characteristics with frequency when the damping factor (c/m) is smaller than 374 according to various embodiments of the disclosure.

Figure 11:
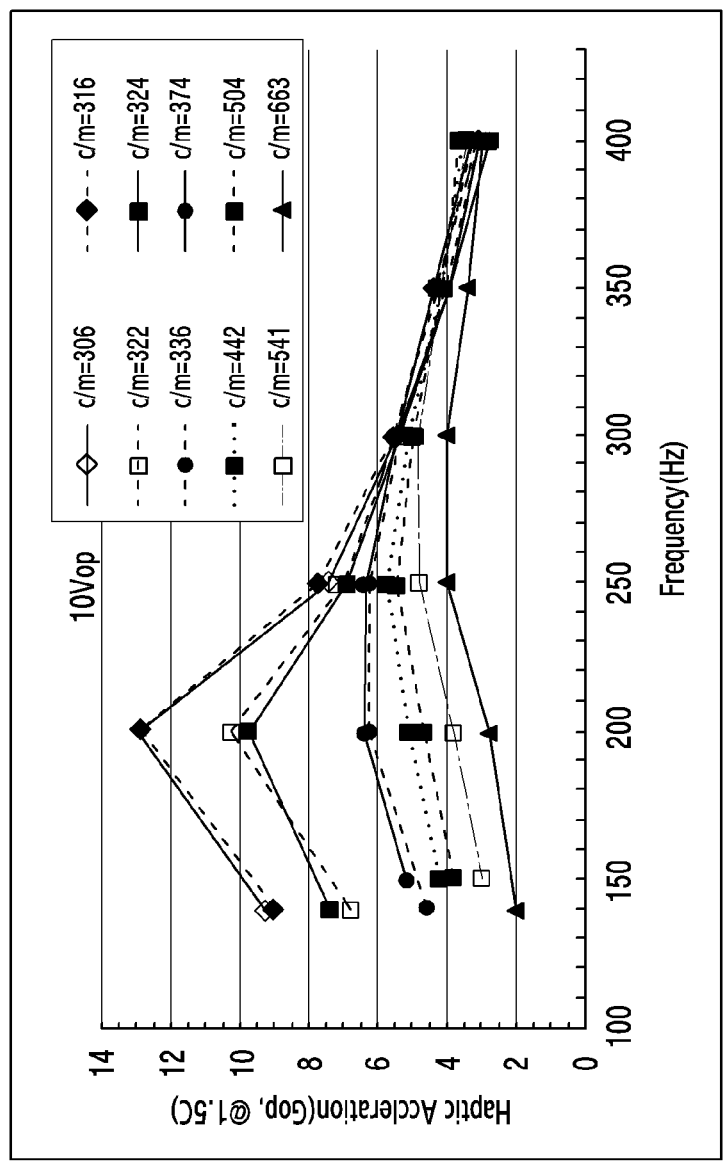
FIG. 11 is a graph showing haptic characteristics with an increase of frequency according to an increase of a damping factor (c/m) according to various embodiments of the disclosure.

FIG. 11 is a graph showing haptic characteristics with an increase of frequency according to an increase of the damping factor (c/m) according to various embodiments of the disclosure.

Referring to FIG. 11, when damping is great (c/m>500), a very weak haptic vibration force is obtained similarly to characteristics shown in FIGS. 6 and 7. On the other hand, when damping is small (c/m<400), a very strong haptic vibration force may be obtained.

According to certain embodiments, the haptic vibration force of the actuator 40 is defined as a maximum vibration force when a voltage in a sine wave of 1.5 period is initially applied. Herein, the period and the form of the applied voltage are merely for explanation of the disclosure. A driving period and a waveform of an applied voltage are changeable according to a purpose of using.

Figure 12:
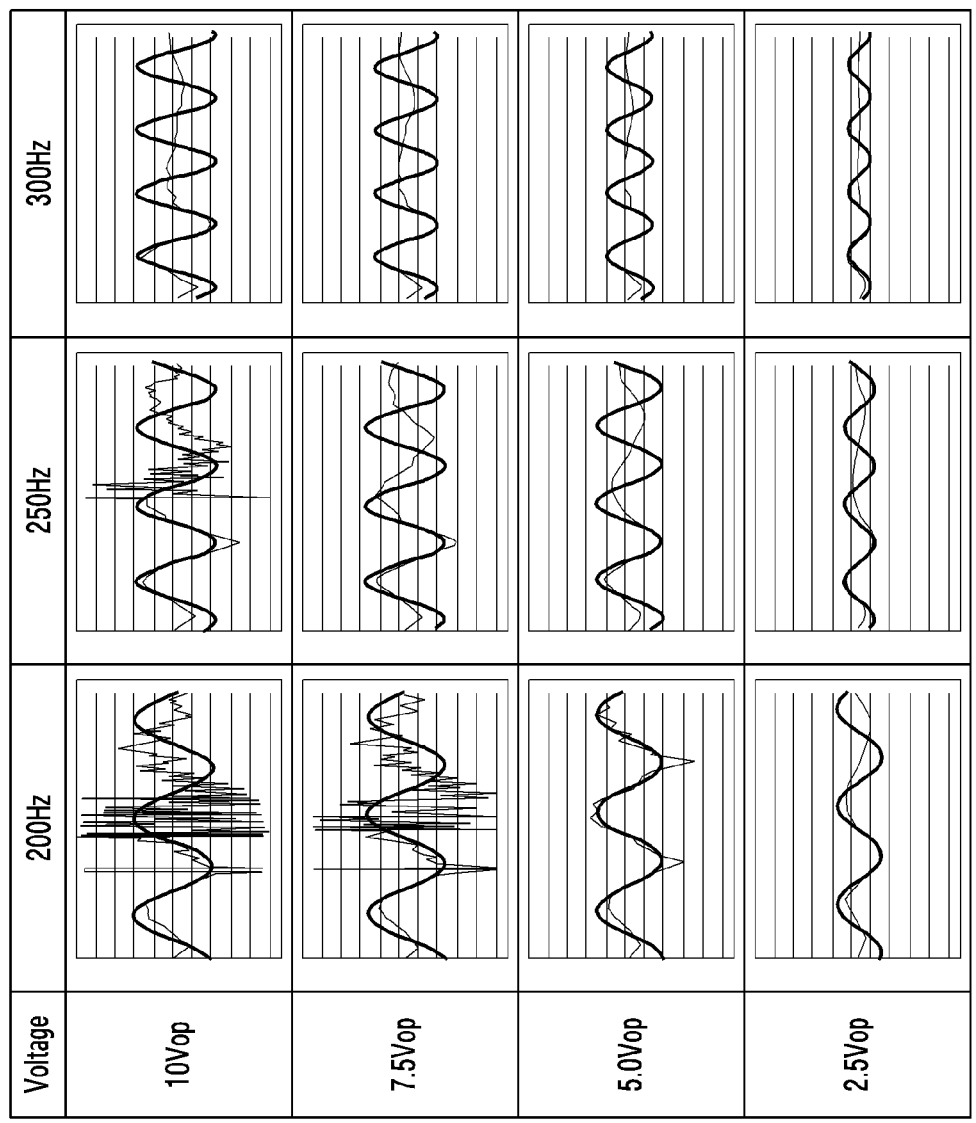
FIG. 12 is a graph showing haptic vibration characteristics with frequency regarding a specimen having a damping factor of 306 according to various embodiments of the disclosure.

FIG. 12 is a graph showing haptic vibration characteristics with frequency regarding a specimen having a damping factor of 306 according to various embodiments of the disclosure.

Referring to FIG. 12, in the case of a specimen having a damping factor of 306, 7 or more types of haptic vibration forces are obtained at 140-205 Hz (see FIG. 11). However, at these frequencies, a vibration waveform is not sinusoidal and a waveform is seriously broken.

When the waveform is seriously broken, a vibration force that a user actually feels may not be strong even if a peak vibration force is very strong, and a noise may be generated and a haptic vibration that a user actually feels is not so good that the actuator cannot be used as a haptic feedback actuator.

Referring to FIG. 12, in the case of 200 Hz, the vibration waveform is broken even with 5 Vop. From the above-described result, it may be seen that, when the damping factor (c/m) is small, a stable vibration waveform may not be obtained in a specific frequency domain.

According to certain embodiments, as a result of reviewing haptic and vibration characteristics according to a damping factor (c/m), if a damping value is very small (>350), a loss may be small and efficiency may be great, but a drastic change in vibration according to a driving voltage and a resonance frequency may be caused in a resonance frequency domain having good efficiency. Accordingly, the vibration is difficult to control and there are many restrictions on implementing constant haptic quality.

On the other hand, if the damping factor is great (>550), an abrupt change in a distribution of vibration according to a frequency may not appear, and haptic and vibration f/b may be provided in a broad frequency band, but energy efficiency may be so low that a user has difficulty in feeling vibration in a normal driving condition used in the electronic device.

Figure 13:
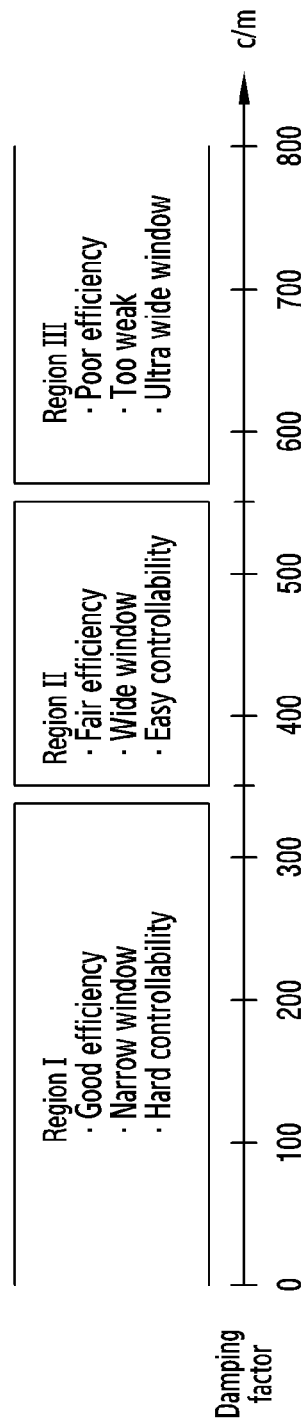
FIG. 13 is a view schematically illustrating performance of an actuator according to a damping factor (c/m) according to an embodiment.

FIG. 13 is a view schematically expressing performance of the actuator 40 according to a damping factor.

Referring to FIG. 13, in a region 1 (Region I), energy efficiency is good, but a change in vibration is so great according to a driving condition (driving voltage, driving frequency) that it is difficult to control. In addition, a response speed (rising time/falling time) is so slow that there are many restrictions on implementing haptic performance.

On the other hand, in a region 3 (Region III), a driving frequency bandwidth is wide and a response speed is fast, but damping is great, a driving current is high, and current consumption increases, so that it is not appropriate to use in an electronic device.

According to certain embodiments, considering current consumption, controllability, a response speed, a structure of an actuator (for example, the actuator 40 shown in FIG. 5) having a damping factor (c/m) ranging from 350 to 550 regions may be deemed to be an optimal structure.

In addition, the embodiments disclosed in the disclosure and the drawings are suggested for easy explanation of the technical features according to embodiments of the disclosure and better understanding of the embodiments of the disclosure, and are not intended to limit the scope of the embodiments of disclosure. Therefore, the scope of various embodiments of the disclosure should be interpreted as including all changes or modified forms derived based on the technical idea of the disclosure, in addition to the embodiments disclosed herein.

What is claimed is:

1. An actuator of an electronic device, the actuator comprising:
   a stator comprising a bracket, a yoke positioned on the bracket, and a coil surrounding a circumference of the yoke;
   a vibrator comprising a permanent magnet surrounding a circumference of the coil, a weight surrounding a circumference of the permanent magnet, and a plate supporting the permanent magnet and the weight;
   an elastic member positioned between the bracket and the vibrator and configured to support the vibrator; and
   a magnet fluid coated over the vibrator to provide damping stability during vibration of the vibrator,
   wherein, in the magnet fluid, an element ratio of magnetic powder to the magnet fluid is between 1.76% and 1.8%, and
   wherein a weight of the magnet fluid is between 0.24% and 0.71% of a weight of the vibrator.

2. The actuator of claim 1, wherein the magnet fluid is coated on an upper surface of the permanent magnet.

3. The actuator of claim 2, wherein the magnet fluid is coated on the permanent magnet in a ring shape.

4. The actuator of claim 1, wherein the magnet fluid has a viscosity of 1000 cp or more.

5. The actuator of claim 1, wherein a damping factor between the magnetic fluid and the vibrator or the elastic member is between 350 and 550.

6. The actuator of claim 1, wherein the yoke is disposed to have a gap of at least 0.05 mm from an inner diameter of the permanent magnet.

7. The actuator of claim 1, wherein the yoke further comprises an insertion protrusion configured to insert into the bracket.

8. The actuator of claim 7, wherein:
   the bracket further comprises a hollow-shaped center protrusion, and
   the insertion protrusion is configured to insert into the hollow-shaped center protrusion to fix the yoke to the bracket.

9. A haptic actuator comprising:
   a stator;
   a vibrator disposed on the stator;
   an elastic member disposed between the stator and the vibrator and configured to support the vibrator; and
   a magnet fluid coated over the vibrator to provide damping stability,
   wherein, in the magnet fluid, an element ratio of magnetic powder to the magnet fluid is between 1.76% and 1.8%, and
   wherein a weight of the magnet fluid is between 0.24% and 0.71% of a weight of the vibrator.

10. The haptic actuator of claim 9, wherein:
    the stator comprises: a bracket; a yoke fixed onto the bracket; and a coil surrounding a circumference of the yoke,
    a coupling structure is disposed between the bracket and the yoke,
    the coupling structure comprises: a hollow-shaped center protrusion formed on the bracket; and an insertion protrusion formed on the yoke can configured to insert into the hollow-shaped center protrusion to fix the yoke to the bracket, and the vibrator comprises: a permanent magnet surrounding a circumference of the coil; and a weight surrounding a circumference of the permanent magnet.

11. An electronic device comprising a housing, the housing comprising at least one haptic feedback actuator,
wherein the haptic feedback actuator comprises:
a stator;
a vibrator disposed on the stator;
an elastic member disposed between the stator and the vibrator and configured to support the vibrator; and
a magnet fluid coated over the vibrator and configured to provide damping stability,
wherein, in the magnet fluid, an element ratio of magnetic powder to the magnet fluid is between 1.76% and 1.8%,
wherein a weight of the magnet fluid is between 0.24% and 0.71% of a weight of the vibrator.

12. The electronic device of claim 11, wherein:
the stator comprises: a bracket; a yoke fixed onto the bracket; and a coil surrounding a circumference of the yoke,
a coupling structure is disposed between the bracket and the yoke, and
the vibrator comprises: a permanent magnet surrounding a circumference of the coil; and a weight surrounding a circumference of the permanent magnet.

13. The electronic device of claim 12, wherein the coupling structure comprises: a hollow-shaped center protrusion formed on the bracket; and an insertion protrusion formed on the yoke and configured to insert into the hollow-shaped center protrusion to fix the yoke to the bracket.

14. The electronic device of claim 12, wherein the yoke is disposed to have a gap of at least 0.05 mm from an inner diameter of the permanent magnet.

15. The electronic device of claim 12, wherein the magnet fluid is coated on an upper surface of the permanent magnet.

16. The electronic device of claim 15, wherein the magnet fluid is coated on the permanent magnet in a ring shape.

17. The electronic device of claim 11, wherein a damping factor between the magnet fluid and the vibrator or the elastic member is between 350 and 550.

18. The electronic device of claim 11, wherein the magnet fluid has a viscosity of 1000 cp or more.

* * * * *

UNITED STATES PATENT AND TRADEMARK OFFICE
CERTIFICATE OF CORRECTION

| | | |
|---|---|---|
| PATENT NO. | : 12,233,436 B2 | Page 1 of 1 |
| APPLICATION NO. | : 17/649394 | |
| DATED | : February 25, 2025 | |
| INVENTOR(S) | : Lee et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 414 days.

Signed and Sealed this
Twenty-second Day of July, 2025

Coke Morgan Stewart
*Acting Director of the United States Patent and Trademark Office*